(12) United States Patent
Finn et al.

(10) Patent No.: US 6,233,818 B1
(45) Date of Patent: May 22, 2001

(54) METHOD AND DEVICE FOR BONDING A WIRE CONDUCTOR

(76) Inventors: David Finn, König-Ludwig-Weg 24, D-87459 Pfronten (DE); Manfred Rietzler, Am Alsterberg 10, D-87616 Marktoberdorf (DE)

( * ) Notice: Subject to any disclaimer, the term of this patent is extended or adjusted under 35 U.S.C. 154(b) by 0 days.

(21) Appl. No.: 09/117,970

(22) PCT Filed: Feb. 12, 1997

(86) PCT No.: PCT/DE97/00261

§ 371 Date: Aug. 7, 1998

§ 102(e) Date: Aug. 7, 1998

(87) PCT Pub. No.: WO97/30418

PCT Pub. Date: Aug. 21, 1997

(30) Foreign Application Priority Data

| Feb. 12, 1996 | (DE) | 196 04 840 |
| May 20, 1996 | (DE) | 196 20 242 |
| May 17, 1996 | (DE) | 196 19 771 |

(51) Int. Cl.$^7$ ............................................. H05K 3/00
(52) U.S. Cl. ................... 29/843; 29/600; 29/827; 235/382
(58) Field of Search ................. 29/850, 825, 830, 29/745, 843, 827, 600; 235/382

(56) References Cited

U.S. PATENT DOCUMENTS

| 3,079,672 | * | 3/1963 | Bam, Jr. et al. ................. 29/850 |
| 3,353,263 | * | 11/1967 | Helms ................................ 29/850 X |
| 4,711,026 | * | 12/1987 | Swiggett et al. ................. 29/850 |
| 4,934,044 | * | 6/1990 | Hasegawa et al. .............. 29/850 |
| 5,025,550 | | 6/1991 | Zirbes et al. . |
| 5,186,378 | | 2/1993 | Alfaro . |
| 5,649,352 | * | 7/1997 | Gustafson ......................... 29/850 X |
| 5,694,680 | * | 12/1997 | Yamada et al. ................. 29/850 |
| 5,809,633 | * | 9/1999 | Mundigl ............................ 29/827 |

FOREIGN PATENT DOCUMENTS

| 36 24 630 A1 | 2/1987 | (DE) . |
| 43 25 334 A1 | 12/1994 | (DE) . |
| 44 08 124 A1 | 9/1995 | (DE) . |
| 44 107 32 A1 | 10/1995 | (DE) . |
| 0 535 433 A2 | 4/1993 | (EP) . |
| 0 689 164 A2 | 12/1995 | (EP) . |
| 2 555 007 A1 | 5/1985 | (FR) . |
| 624369 | 6/1949 | (GB) . |
| 62-008313 | * 1/1987 | (JP) . |
| WO 91/16718 | 10/1991 | (WO) . |
| WO 93/20537 | 10/1993 | (WO) . |
| WO 94/28562 | 12/1994 | (WO) . |
| WO 96/07984 | * 3/1996 | (WO) . |

OTHER PUBLICATIONS

Hermann G., Egerer K. 1991 Band 2: Neue Verfahren, Neue Technologien Handbuch der Leiterplatentechnik, vol. 2, pp. 142–146.

* cited by examiner

*Primary Examiner*—Carl J. Arbes
(74) *Attorney, Agent, or Firm*—McGlew and Tuttle, P.C.

(57) ABSTRACT

Process and device for the contacting of a wire conductor (113) in the course of the manufacture of a transponder unit arranged on a substrate (111) and comprising a wire coil (112) and a chip unit (115), wherein in a first phase the wire conductor (113) is guided away via the terminal area (118, 119) or a region accepting the terminal area and is fixed on the substrate (111) relative to the terminal area (118, 119) or the region assigned to the terminal area, and in a second phase the connection of the wire conductor (113) to the terminal area (118,119) is effected by means of a connecting instrument (125).

33 Claims, 9 Drawing Sheets

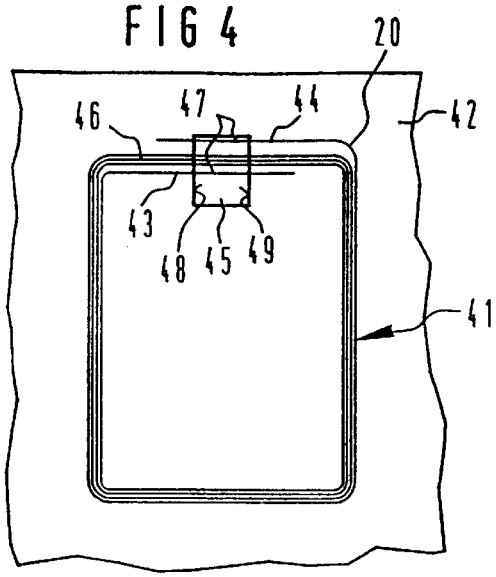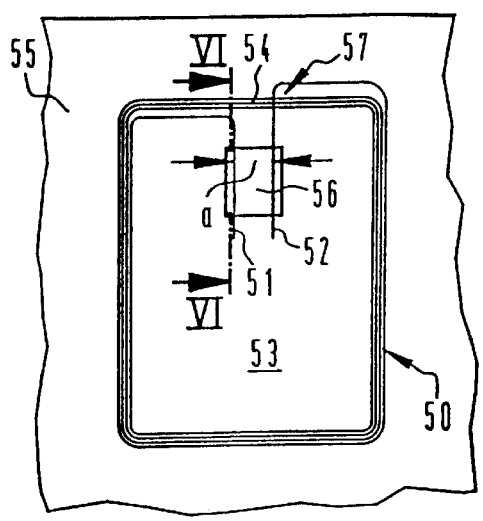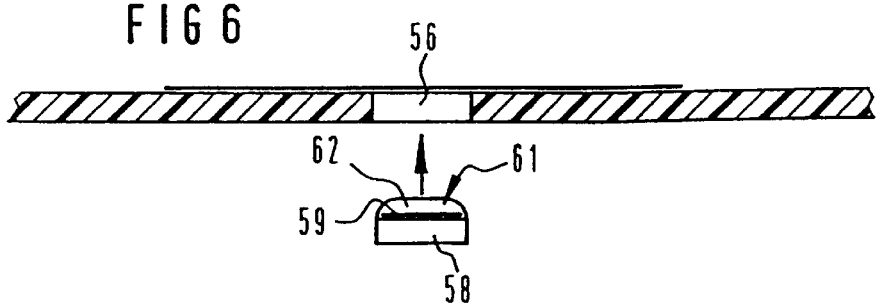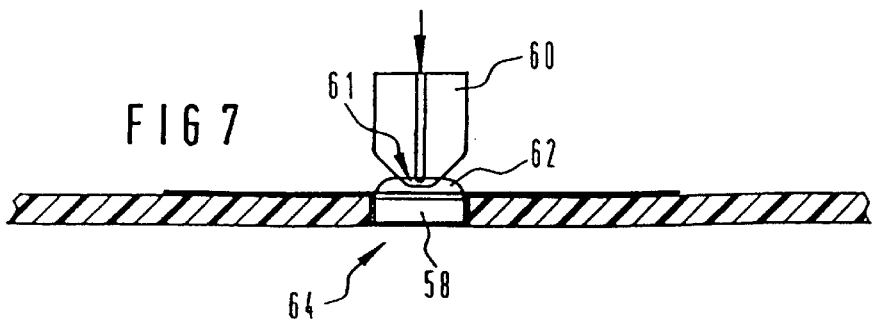

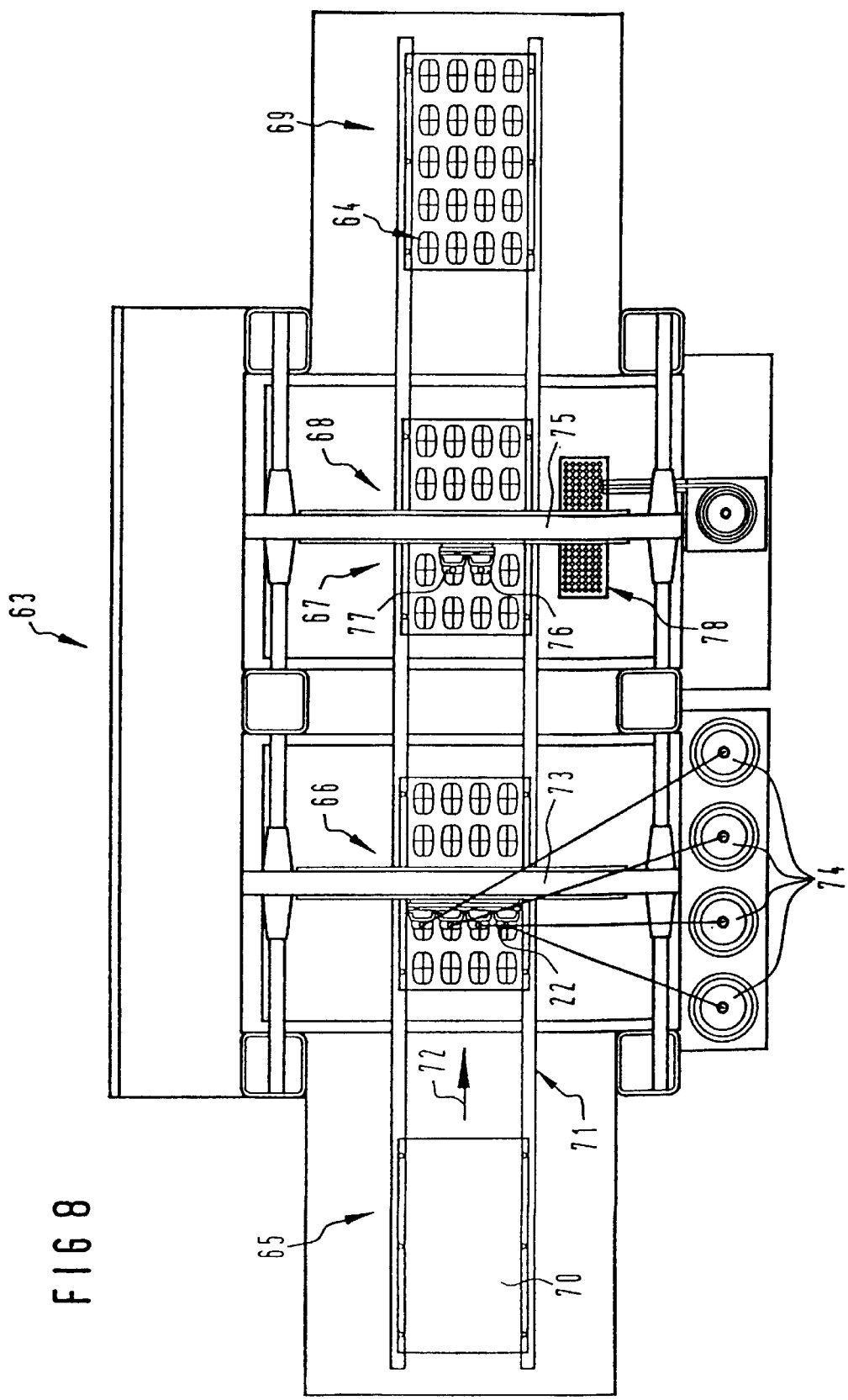

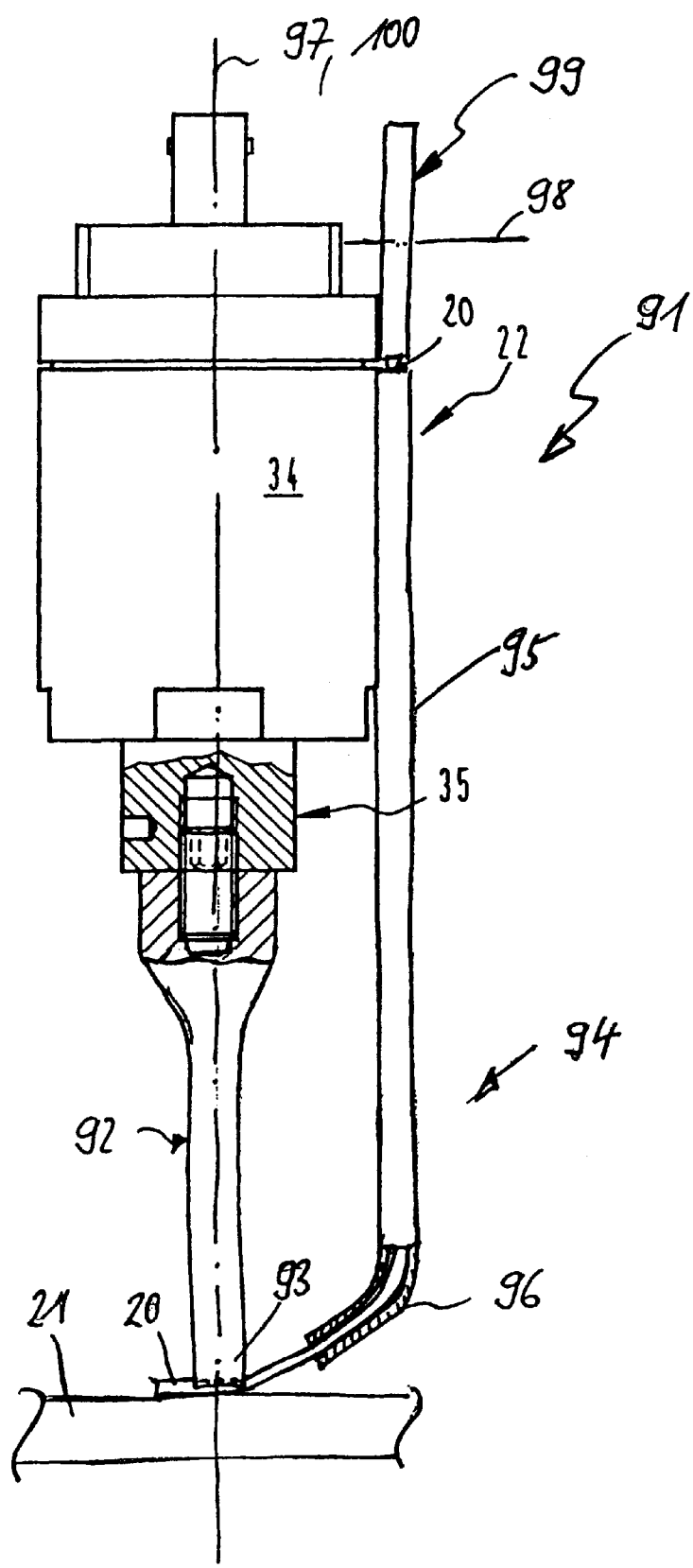

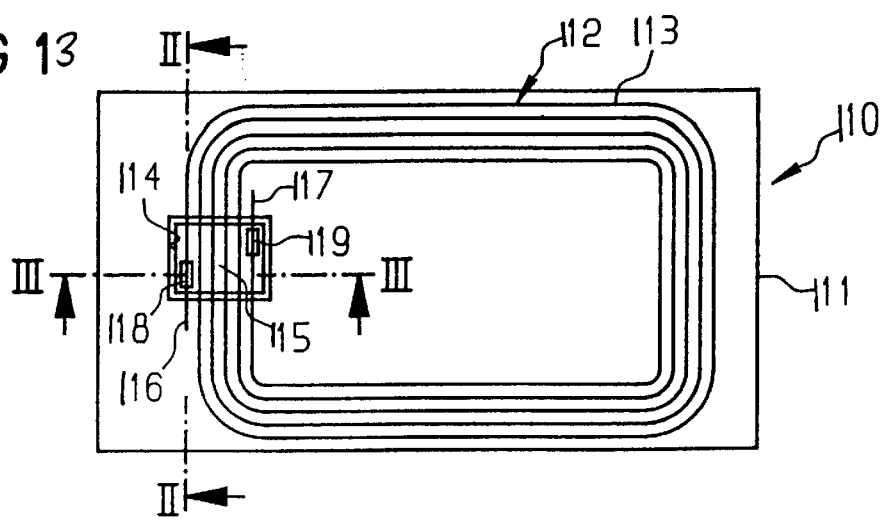
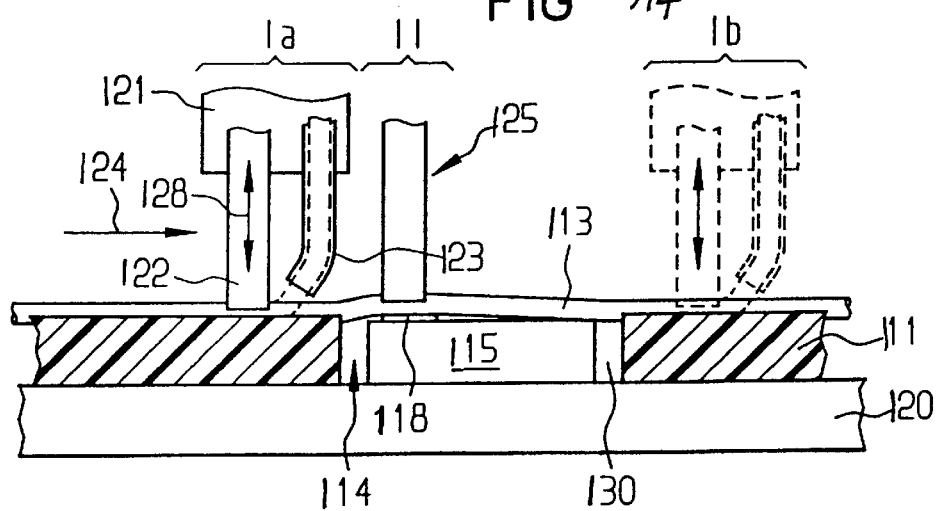
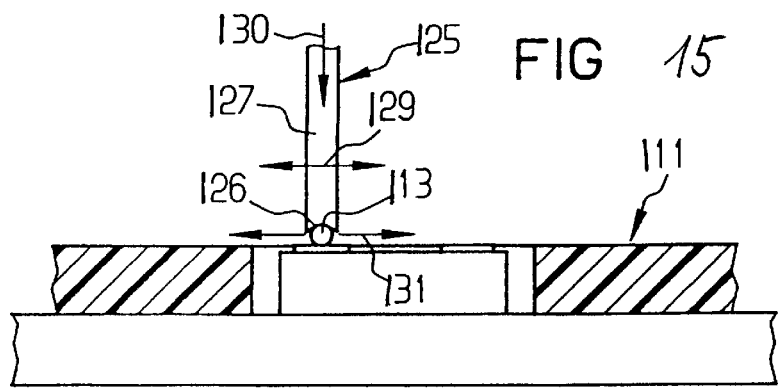

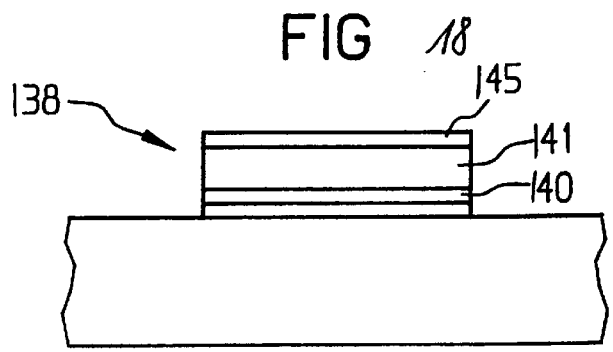
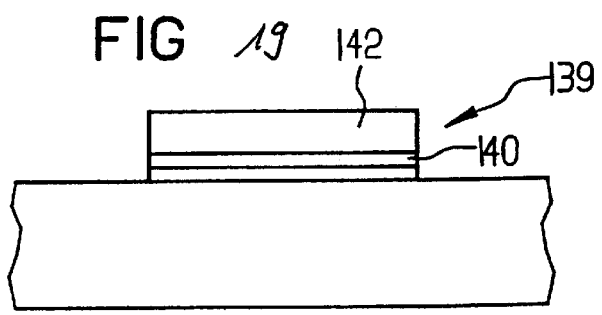
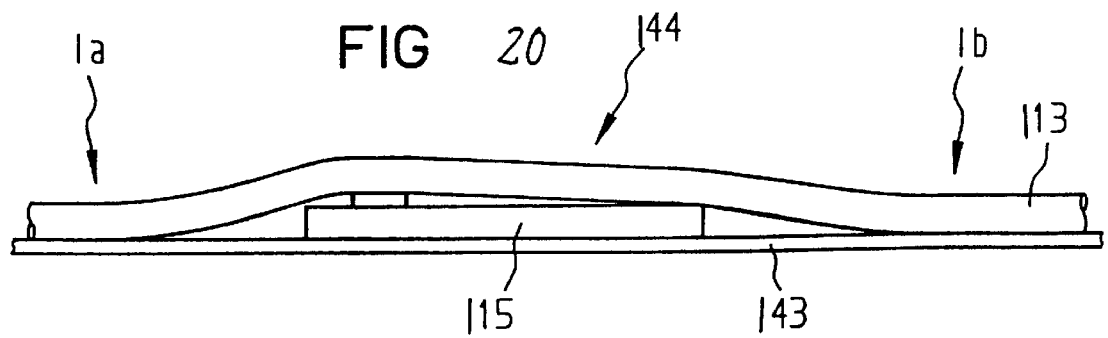

US 6,233,818 B1

METHOD AND DEVICE FOR BONDING A WIRE CONDUCTOR

FIELD OF THE INVENTION

The present invention relates to a process for the contacting of a wire conductor in the course of the manufacture of a transponder unit arranged on a substrate and comprising a wire coil and a chip unit and a device for implementing the process and a device for the wiring of a wire-shaped conductor on a substrate.

BACKGROUND OF THE INVENTION

In particular in the course of the manufacture of transponder units arranged on a substrate and comprising, by way of essential elements, a wire coil and a chip unit which has been contacted with the ends of the coil, the contacting of the ends of the coil with the terminal areas of the chip unit proves to be a particular problem. This is mainly due to the very small dimensions of the components to be connected to one another. For instance, the terminal areas of a chip unit, which as a rule are of square or approximately square design, customarily have an edge length of about 100 to 150 $\mu$m. By way of coil wire, particularly for the purpose of forming low-frequency coils, use is made of a copper wire having a diameter which as a rule amounts to around 50 $\mu$m.

As can be gathered from WO 91/16718 for instance, in the past a direct contacting of the ends of the coil wire with the terminal areas of a chip unit has been circumvented through use being made, by way of coupling element between the ends of the coil wire pertaining to a wire coil arranged on a coil substrate and the terminal areas of the chip unit, of a contact substrate comprising enlarged terminal areas, so that by virtue of the contact faces of the contact substrate that are very large in comparison with the diameter of the coil wire a contact could be brought about without making great demands as regards the precision of the relative positioning between the ends of the coil wire and the contact faces. Since with the known process the chip unit is equipped with additional contact conductors for the purpose of making contact with the enlarged terminal areas of the substrate, in the case of the manufacturing process known from WO 91/16718 a total of at least three contacting steps are required in order finally to establish an electrically conductive contact between the terminal areas of the chip unit and the wire coil.

SUMMARY AND OBJECTS OF THE INVENTION

The object underlying the invention is therefore to propose a process and also a device enabling direct contacting of wire ends on the terminal areas of a chip unit. Of the manufacture of a transponder unit arranged on a substrate and comprising a wire coil and a chip unit, the coil wire is guided in a first process step via the assigned terminal area of the chip unit, or a space that is intended to accept this terminal area, and is fixed to the substrate. By this means an exactly defined alignment of the coil wire relative to the terminal area is obtained after the first process step has been carried out. In the second process step the connection of the wire conductor to the terminal area is then effected by means of a connecting instrument.

By virtue of the process according to the invention there is no longer any necessity, with a view to bringing the terminal areas of the chip unit into contact with the ends of the coil, to provide a separate contact substrate on which enlarged terminal areas are formed. Rather, the coil substrate, which is used in any case as substrate for the wire coil and which, for example in the case where the transponder unit is intended to serve for the manufacture of a chip card, is formed by means of a plastic support sheet corresponding to the dimensions of the chip card, serves virtually as a contacting or positioning aid for the relative positioning of the ends of the coil in relation to the terminal areas of the chip unit. In this case the chip unit may either be arranged in a recess in the substrate provided for this purpose or may be provided on the surface of the substrate. The first alternative affords the possibility of arranging the chip unit in the recess optionally prior to fixation of the wire conductors or of introducing the chip unit into the recess only after fixation of the wire conductors, in order subsequently to implement the actual contacting of the wire conductors on the terminal areas.

By virtue of the wire conductors which are fixed on the coil substrate the process according to the invention consequently enables simplified contacting of the wire conductors with the terminal areas of the chip unit.

With one variant of the process, which independently of for bringing a terminal area into contact with a wire conductor also enables an advantageous arrangement of the wire conductor on the substrate, the wire conductor is subjected to the action of ultrasound in a direction transverse to the wiring plane, and the transverse movement of the wiring device induced by the action of ultrasound is superimposed on the wiring movement extending in the wiring plane.

The superimposition of the wiring movement together with the transverse movement countersinking the cross-section of the wire conductor in the surface of the substrate or bringing it into close contact with the latter enables continuous operation of the wiring device, so that the wire conductor is capable of being connected to the surface of the substrate not only in the region of definite connecting points but over any length without the actual wiring movement having to be interrupted in the process. Furthermore, the transverse movement induced by ultrasound proves to be particularly effective during the at least partial countersinking or the close contacting of the cross-section of the wire, since the movement induced by the ultrasound extends in the direction of sinking and not transversely thereto, as is the case with the process described in the introduction.

It proves to be particularly advantageous if the transverse movement induced by ultrasound takes place along a transverse-movement axis that is variable as regards its angle in relation to the axis of the wiring movement. By this means it is possible to adjust the transverse-movement axis so as to conform to the special requirements. Thus it is possible in the case where an elevated temperature of the wire conductor to be countersunk is desired, possibly depending on the substrate material, to align the transverse-movement axis more in the direction of the wiring-movement axis, in order in this way to obtain a greater longitudinal-force component which acts on the wire conductor and which as a consequence of the associated rubbing of the wire guide on the wire conductor results in heating of the same. In order to obtain a rate of sinking of the wire conductor in the surface of the substrate that is as high as possible it can be advantageous to align the transverse-movement axis at an angle of 45° to the wiring-movement axis, in order to achieve a shearing effect in the substrate material that is as great as possible.

In order to vary the depth of penetration of the wire conductor into the surface of the substrate, the ultrasonic frequency and/or the angle between the axis of the wiring movement and the transverse-movement axis may also be varied.

With respect to a connecting process following the wiring of the wire conductor in the form of a wire coil on the surface of the substrate for the purpose of connecting the wire conductor to terminal areas of a chip unit it can prove particularly advantageous if the final region of the coil and the initial region of the coil are guided via a recess in the substrate, so that the subsequent connection of the terminal areas of a chip unit to the initial region of the coil and to the final region of the coil can be effected without impairment caused by the substrate material.

In order to enable an alignment of the initial coil region and of the final coil region that is as rectilinear as possible between opposite edges of the recess it is advantageous to interrupt the exposure of the wire conductor to ultrasound in the region of the recess.

An interruption of the exposure of the wire conductor to ultrasound also proves to be advantageous for the purpose of crossing an already wired section of wire in the crossing region, whereby in addition the wire conductor in the crossing region is guided in a crossing plane that is spaced from the wiring plane. This ensures that a crossing of wire conductors becomes possible without it being possible for damage to occur in the process as a result of collision of the wire conductors, which could possibly result in destruction of the insulation of the wire conductors.

The use of the process described above in various embodiments has also proved to be particularly advantageous for the manufacture of a card module having a substrate, a coil which is wired on the substrate and a chip unit which is connected to the coil. In this case a coil having an initial coil region and a final coil region is formed on the substrate in a wiring phase by means of the wiring device, and in a subsequent connection phase a connection to terminal areas of the chip unit is brought about between the initial region of the coil and the final region of the coil by means of a connecting device.

As a result of the integration of the wiring of the wire conductor on the substrate into a process for the manufacture of a card module on the basis of any substrate that permits an at least partial penetration of the wire conductor into the surface of the substrate or close contact of the wire conductor against the surface of the substrate, this application of the process enables the formation of card modules that are easy to handle and that are used as semifinished products in the manufacture of chip cards. With a view to completion of the chip card the card modules are then, as a rule, provided on both sides with laminated surface layers. Depending on the configuration and thickness of the substrate material, the connection between the wire conductor and the substrate material can be effected via a more or less positive inclusion of the cross-section of the wire conductor in the surface of the substrate—for instance, when the substrate is formed from a thermoplastic material—or by means of a predominantly close-contact fixing of the wire conductor on the surface of the substrate, for instance by bonding the wire conductor together with the surface of the substrate. The latter will be the case, for example, when the substrate material is a fleece-type or woven-fabric-type support.

Particularly in the course of the manufacture of paper bands or card bands such as are used, for example, for identifying luggage, the connection of the wire conductor to the surface of the substrate via a layer of adhesive between the wire conductor and the surface of the substrate has proved to be advantageous. In this case the wire conductor comes into close contact against the surface of the substrate in a peripheral region via the layer of adhesive. If the wire conductor is provided with a suitable surface coating, for example baking lacquer, the layer of adhesive may be formed from the surface coating.

With the application of the process as described above, the use of a thermocompression process for connecting the initial region of the coil and the final region of the coil to the terminal areas of the chip unit has proved to be particularly effective.

It is possible for a further increase in the effectiveness of the application of the process as described above to be achieved if a plurality of card modules are manufactured at the same time in such a way that in a feed phase a plurality of substrates arranged collected together in a yield are supplied to a card-module production device comprising a plurality of wiring devices and connecting devices and subsequently in the wiring phase a plurality of coils are formed simultaneously on substrates arranged in a row, then in the connection phase a plurality of chip units are connected via their terminal areas to the coils and finally in a separation phase a separation of the card modules from the composite yield takes place.

Furthermore, an application of the process for the manufacture of a rotationally symmetrical coil bobbin has proved advantageous wherein the wire-shaped conductor is wired on a substrate taking the form of a winding support and rotating relative to the wiring device. For the purpose of establishing the relative rotation there is the possibility either to cause the substrate to rotate about its longitudinal axis in the case of a stationary wiring device or, in the case of a stationary substrate, to move the wiring device on a trajectory about the longitudinal axis of the substrate, or even to superimpose the two aforementioned types of motion.

The aforementioned application of the process enters into consideration in particular for the manufacture of a moving coil of a loudspeaker unit that is integrally connected to a vibrating diaphragm.

According to another application of the process the process serves to wire a wire-shaped conductor on a substrate by means of a wiring device that subjects the wire conductor to ultrasound with a view to manufacturing a ribbon cable, whereby a number of wiring devices corresponding to the number of cable conductors desired is arranged transversely in relation to the longitudinal axis of a ribbon-shaped substrate and a relative movement between the substrate and the wiring devices takes place in the direction of the longitudinal axis of the substrate.

In order to achieve a reliable and operationally dependable contact between the wire conductor and the terminal areas of the chip unit, which are customarily constituted by aluminium surfaces, it is advantageous, particularly when use is made of a copper wire conductor, to subject the aluminium surface of the terminal areas to a preparatory treatment. With a particularly advantageous embodiment of the process according to the invention the preparatory treatment of the aluminium surface is virtually integrated into the actual connecting operation—that is to say, the contacting of the wire conductor with the terminal areas by virtue of the wire conductor being connected to the terminal areas by means of a connecting instrument taking the form of an ultrasonic instrument. In this case an oxide layer disposed on the aluminium surface is eliminated mechanically by subjecting the oxide layer to the ultrasonic vibrations of the ultrasonic instrument. This manner of cleansing the aluminium surfaces of the oxide layer, which takes place substantially at the same time as the actual connecting operation, has the particular advantage that with regard to shielding the connecting points from environmental influences—by creating an inert or reducing atmosphere, for example—it is possible to dispense with special measures intended to prevent the formation of a fresh oxide layer prior to implementation of the connecting operation.

If, on the other hand, as an alternative to the aforementioned ultrasonically induced removal of the oxide layer in conjunction with an ultrasonic connecting operation a preparatory treatment or cleansing process is chosen that is decoupled from the actual connecting operation, the connecting operation itself can be carried out in an inert or reducing atmosphere.

The use of etching processes that have great selectivity proves to be particularly advantageous for the purpose of cleansing the aluminium surfaces pertaining to the terminal areas of oxide layers. An example of dry-etching processes is ion-beam etching. But the use of processes that can be implemented easily, such as wet etching or oxide-layer removal by laser treatment, in particular by excimer-laser treatment, is also advantageous.

With a view to preventing renewed oxidation of the aluminium surface there is also the possibility of providing the aluminium surface with a multilayered contact metallisation having a zincate layer applied to the aluminium surface by way of intermediate layer and having an interconnect layer which is disposed on said zincate layer and which is provided for making contact with the wire conductor. In this case the zincate layer serves primarily to eliminate the oxide layer on the aluminium surface, and the interconnect layer, which may for instance consist of nickel or palladium or corresponding alloys, serves to improve the adhesion to the copper wires which are used as a rule by way of wire conductors.

In the case where use is made of an ultrasonic instrument for establishing the connection between the wire conductor and the terminal areas it proves to be particularly advantageous if the vibrational loading of the wire conductor which is brought about by ultrasound takes place in a plane substantially parallel to the terminal area and transverse to, for instance at right angles to, the longitudinal axis of the wire conductor. For, by virtue of the transverse flexibility of the wire conductor which is fixed on the substrate on both sides of the terminal area in the longitudinal direction the greatest possible relative movements can be achieved between the wire conductor and the aluminium surface by means of the ultrasonic loading of the wire conductor which takes place transverse to the longitudinal axis of the wire.

Irrespective of the type and manner of the preparatory treatment and also of the choice of the connecting process it is a particular advantage if by way of coil substrate use is made of a plastic support sheet which together with the coil and the chip unit forms a card inlet for the manufacture of a credit card or such like. Alternatively, differing configurations of the coil carrier are also possible which in each case—that is to say, irrespective of the particular configuration—merely have to enable secure bilateral fixation of the wire conductor relative to the terminal areas of the chip unit. By this means a virtually suspended arrangement and hence a "floating acceptance" of the chip in the substrate also becomes possible. For instance, the use of a sheet of paper by way of coil substrate is also possible, in which connection the wire conductor may be fixed on the substrate via an adhesive layer which is provided on the sheet of paper and which adheres to the wire conductor, or even via an adhesive layer which is provided on the wire conductor itself, for instance a layer of baking lacquer.

Irrespective of the type of coil substrate which is used, it proves to be advantageous if the wire conductor is fixed on the substrate by means of a wiring instrument which is employed in any case for the coil-shaped arrangement of the wire conductor on the substrate and which enables a continuous or intermittent connection of the wire conductor to the surface of the substrate. In this case, particularly when use is made of plastic substrates, it proves to be advantageous if by way of wiring instrument an ultrasonic instrument is employed which enables an at least partial embedding of the cross-section of the wire conductor into the surface of the substrate and hence enables fixation with good adhesion.

A particularly good fixation of the wire conductor on the surface of the substrate and the establishment of a particularly reliable connection of the wire conductor to the terminal areas of the chip unit is possible if the ultrasonic instrument which is used for the wiring and fixation of the wire conductor on the substrate brings about a vibrational loading of the wire conductor transverse to the longitudinal axis of the wire conductor and transverse to the surface of the substrate, and if the ultrasonic instrument which is used for connecting the wire conductor to the terminal areas brings about a vibrational loading of the wire conductor in a plane substantially parallel to the substrate and transverse to the longitudinal axis of the wire conductor.

The wiring device for wiring a wire-shaped conductor on a substrate by means of ultrasound comprises a wire guide and an ultrasonic generator, whereby the ultrasonic generator is connected to the wire guide in such a way that the wire guide is stimulated to execute ultrasonic vibrations in the direction of the longitudinal axis.

It is advantageous if the device that is suitable for implementing the process according to the invention comprises an ultrasonic instrument with a vibrating punch partially encompassing the cross-section of the wire and having an ultrasonic oscillator which brings about a vibrational loading of the vibrating punch transverse to the longitudinal axis of a wire conductor that is guided by the vibrating punch.

According to a preferred embodiment of the device the. ultrasonic instrument is coupled to a wire-laying instrument.

A particularly simple configuration of the device becomes possible if the ultrasonic oscillator of the ultrasonic instrument serves simultaneously for ultrasonic loading of the wiring instrument, for instance by the ultrasonic oscillator being arranged in such a way that the axis of its effective direction is variable.

It proves to be advantageous for the design of the wiring device if the latter is equipped with a wire-guidance capillary which at least in the region of a wire-guide nozzle extends in the wire guide parallel to the longitudinal axis. In this manner it is ensured that in the region of the wire-guide nozzle the axial advancing movement of the wire conductor is not impaired by ultrasonically induced transverse loads. Rather the ultrasonic loading extends in the longitudinal direction of the wire.

For the purpose of introducing the wire conductor into the wire guide, however, it proves to be advantageous if the wire guide comprises, spaced from the wire-guide nozzle, at least one wire-feed channel extending obliquely in relation to the longitudinal axis of the wire.

With a view to avoiding ultrasonically induced transverse loads on the wire conductor in the region of the wire-guide nozzle it also helps if the ultrasonic generator is arranged coaxially with respect to the wire guide.

The process according to the invention and devices that are suitable for implementing the process are elucidated below in exemplary manner on the basis of the drawings.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

BRIEF DESCRIPTION OF THE DRAWINGS

In the drawings:

FIG. 4 a wire conductor wired in coil form on a substrate with ends guided away via a recess in the wire conductor;

FIG. 5 a coil configuration that is varied in comparison with FIG. 4 with wire ends guided away via a substrate recess;

FIG. 6 the placement of a chip unit in the substrate recess represented in FIG. 5;

FIG. 7 the connection of the wire ends represented in FIG. 5 to terminal areas of the chip unit which is inserted in the recess;

FIG. 8 a production device for the manufacture of card modules;

FIG. 12 another wiring device for wiring a wire conductor by means of ultrasound.

FIG. 13 is a top view of a card inlet pertaining to a chip card with a transponder unit formed from a wire coil and a chip unit;

FIG. 14 is a sectional representation of the card inlet represented in FIG. 13 according to the course of the line of intersection II—II, for the purpose of elucidating the manufacturing process;

FIG. 15 is another sectional representation of the card inlet represented in FIG. 13 according to the course of the line of intersection III—III;

FIG. 18 is a possible contact metallization of a terminal area of a chip with contacting according to the process represented in FIG. 17;

FIG. 19 is another possible contact metallization of a terminal area of a chip; and FIG. 20 is a representation corresponding in its view to FIG. 14 of a transponder unit arranged on a coil substrate.

FIG. 1 shows, in a schematic representation, the wiring of a wire conductor 20 on a substrate 21 by means of a wiring device 22 with a wire guide 23 which is subjected to the action of ultrasound.

Figure 1:
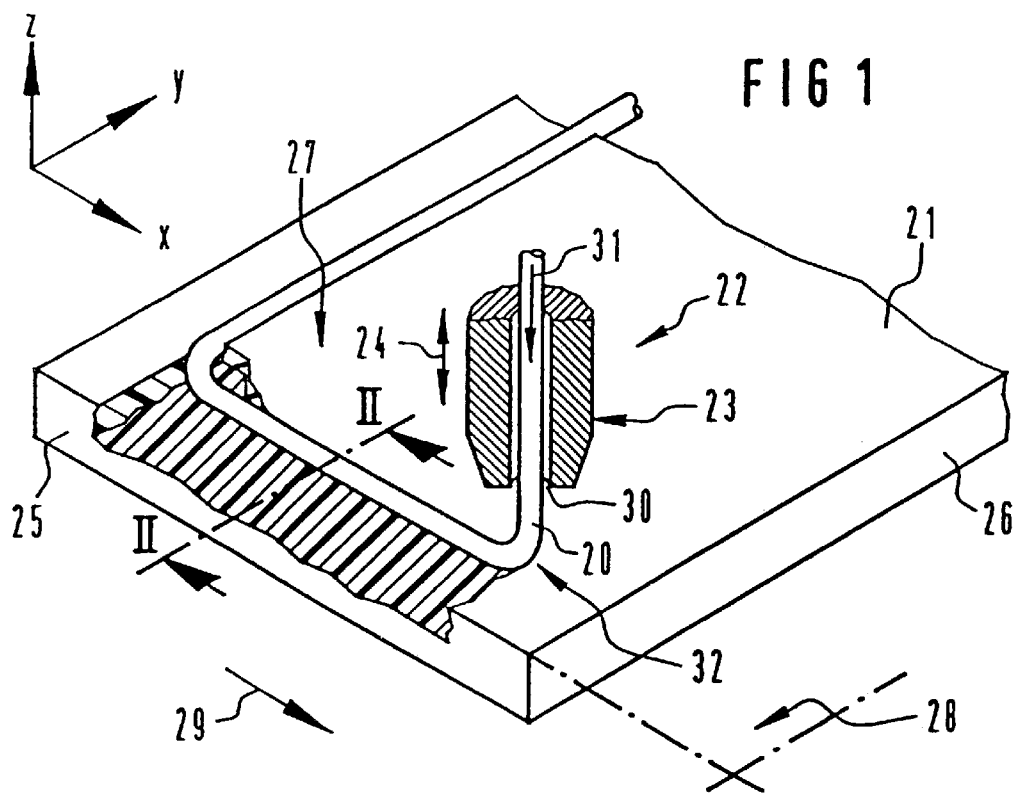
FIG. 1 a schematic representation of the wiring of a wire conductor on a substrate by means of ultrasound.

The wiring device 22 represented in FIG. 1 is designed to be capable of being displaced along three axes and is subjected to the action of ultrasound which stimulates the wire guide 23 to execute oscillating transverse movements (arrow 24), which in the example represented in FIG. 1 are aligned perpendicular to a wiring plane 28 spanned by lateral edges 25, 26 of a substrate surface 27.

For the purpose of wiring, the wire conductor 20 is moved out of a wire-guide nozzle 30 while executing a continuous advancing movement in the direction of the arrow 29, whereby at the same time the wire guide 23 executes a wiring movement 29 which extends parallel to the wiring plane 28 and which in FIG. 1 can be retraced from the course of the wire-conductor section already wired on the substrate 21. On this wiring movement, which extends in the region of the front lateral edge 25 in the direction of the arrow 29, the oscillating transverse movement 24 is superimposed. This results in an impinging or impacting of the wire-guide nozzle 30 on the wire conductor 20 which is repeated in rapid succession corresponding to the ultrasonic frequency, leading to a compression and/or displacement of the substrate material in the region of a contact point 32.

Figure 2:
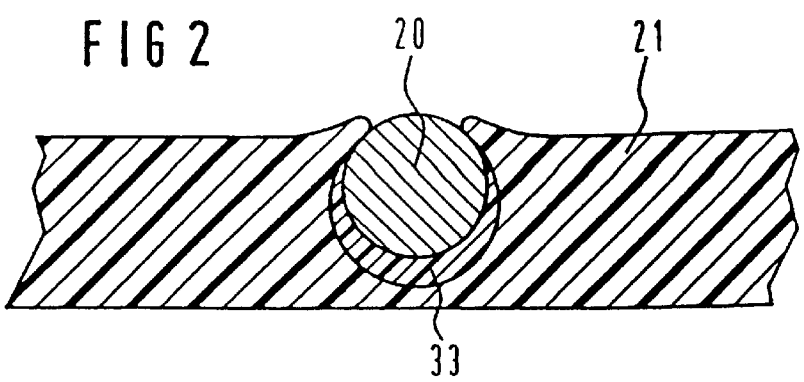
FIG. 2 an electron micrograph for the purpose of representing a wire conductor embedded in the substrate.

FIG. 2 shows in a sectional representation, which corresponds roughly to the course of the line of intersection II—II indicated in FIG. 1, the embedded arrangement of the wire conductor 20 in the substrate 21. The substrate represented here is a PVC sheet, whereby for the purpose of embedding the wire conductor 20 the wire conductor is subjected via the wiring device 22 to, for example, an ultrasonic power output of 50 W and an ultrasonic frequency of 40 kHz. The contact force with which the wire-guide nozzle 30 is caused to abut the substrate surface 27 may, in the case of the aforementioned substrate material, lie in the range between 100 and 500 N. As is evident from the representation according to FIG. 2, in a test which was carried out by adjusting the aforementioned parameters an embedding of the wire conductor 20 into the substrate 21 was obtained substantially by virtue of a compression of the substrate material in a compression region 33 of the substrate material which here is crescent-shaped.

The wiring principle represented in FIG. 1 can be universally employed. For instance, departing from the use elucidated in detail below in connection with the manufacture of a card module (FIGS. 4 to 7), the principle may also find application in connection with the wiring of wire coils in plastic casings, for instance in order to form an aerial for a cordless telephone (mobile phone) or in order to form a measuring coil of a sensor.

Figure 3:
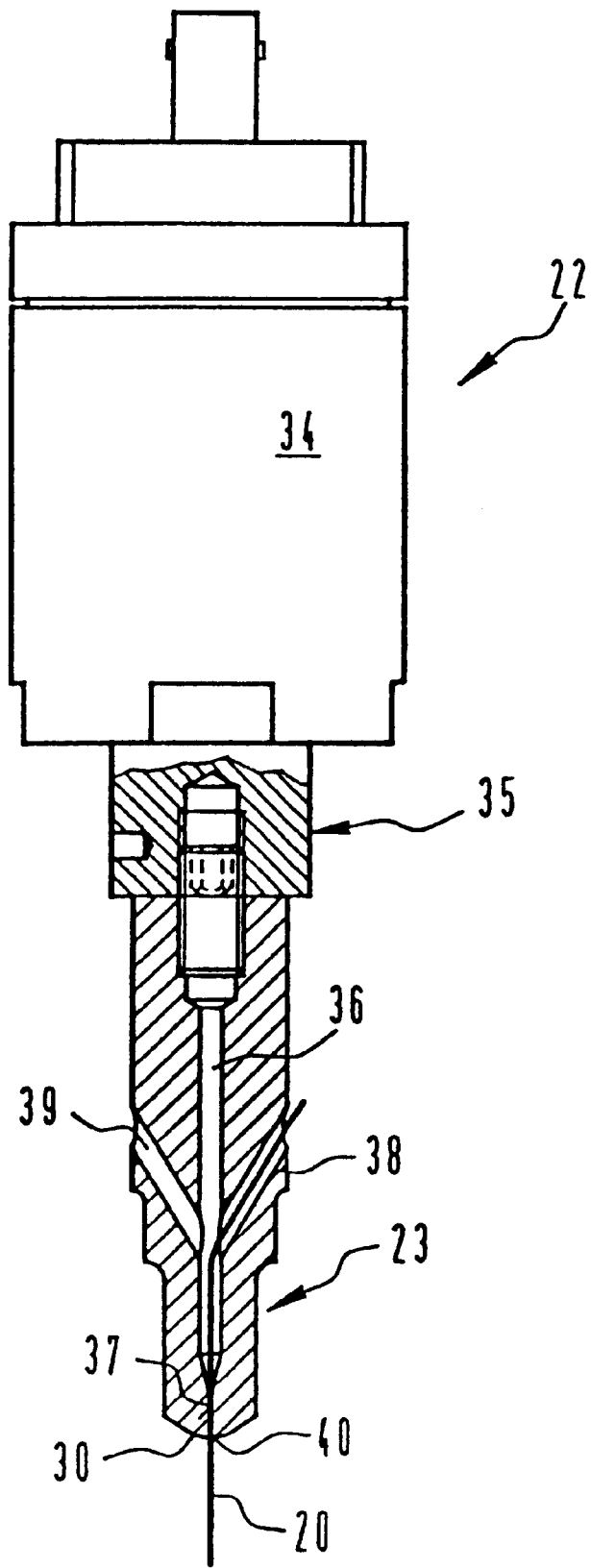
FIG. 3 a wiring device for wiring a wire conductor by means of ultrasound.

FIG. 3 shows the wiring device 22 in an individual representation with an ultrasonic generator 34 which is arranged coaxially with respect to the wire guide 23 and is rigidly connected to the latter in a connecting region 35. Overall the wiring device 22 represented in FIG. 3 is of rotationally symmetrical construction. The wire guide 23 comprises a central longitudinal bore 36 which in the region of the wire-guide nozzle 30 merges with a wire capillary 37 which in comparison with the longitudinal bore 36 has a narrowed diameter that is matched to the diameter of the wire conductor 20. The wire-guidance capillary 37 serves primarily to be able to align the wire conductor exactly in the wiring plane 28 (FIG. 1).

In the embodiment example represented in FIG. 3 there are arranged to the side of the wire guide 23, above the wire-guide nozzle and leading into the longitudinal bore 36, two wire-feed channels 38, 39 which extend obliquely downwards in the direction of the wire-guide nozzle 30. The wire-feed channels 38, 39 serve for lateral introduction of the wire conductor 20 into the wire guide 23, so that the wire conductor 20, as represented in FIG. 3, extends laterally on a slant into the wire-feed channel 38, through the longitudinal bore 36 and, guided out of the wire-guidance capillary 37, through the wire guide 23. In this case the multiple arrangement of the wire-feed channels 38, 39 permits selection of the wire-supply side of the wire guide 23 that is most favourable in the given case.

As is further evident from FIG. 3, the wire-guide nozzle 30 is of convex construction in the region of a wire outlet 40 in order to enable a deflection of the wire conductor 20 that is as non-damaging as possible in the region of the contact point 32 (FIG. 1) or in the region of the wire outlet 40 in the course of the wiring operation represented in FIG. 1.

Although not represented in any detail in FIG. 3, the wire guide 23 may be equipped with a wire-severing instrument and a wire-advancing instrument. In this case the wire-severing device may be directly integrated into the wire-guide nozzle 30. FIG. 4 shows a wire conductor 20 which, for the purpose of forming a coil 41 which in this case takes the form of a high-frequency coil, is wired on a substrate 42. The coil 41 here has a substantially rectangular configuration with an initial coil region 43 and a final coil region 44 which are guided away via a window-shaped substrate recess 45. In this case the initial coil region 43 and the final coil region 44 are in parallel alignment with a main coil strand 46 which they accept between them in the region of the substrate recess 45. In the course of the ultrasonic wiring of the wire conductor 20 already elucidated in principle with reference to FIG. 1 the ultrasonic loading of the wire conductor 20 is interrupted while the latter is being guided away via the substrate recess in the course of the wiring operation, in order on the one hand to ensure no impairment of the alignment of the wire conductor 20 in an unrestrained region 47 between the recess edges 48, 49 located opposite one another and on the other hand in order to rule out stressing of the connection between the wire conductor 20 and the substrate 42 in the region of the recess edges 48, 49 by tensile stresses on the wire conductor 20 as a consequence of ultrasonic loading.

FIG. 5 shows, in a configuration that is modified in comparison with FIG. 4, a coil 50 with an initial coil region 51 and a final coil region 52 which are guided, angled in relation to a main coil strand 53, into an interior region of the coil 50. The coil 50 is arranged on a substrate 55 which comprises a substrate recess 56 in the interior region 53 of the coil 50. In order to be able to guide away both the initial coil region 51 and the final coil region 52 via the substrate recess 56, in the case of the configuration represented in FIG. 5 the final coil region 52 has to be guided away beforehand in a crossing region 57 via the main coil strand 44. In order in this case to prevent damage to or a partial stripping of the wire conductor 20, similarly as in the region of the substrate recess 56 the ultrasonic loading of the wire conductor 20 is interrupted in the crossing region 57. Furthermore, the wire guide 23 is slightly raised in the crossing region 57.

FIG. 6 shows, in a view of the substrate 55 corresponding to the course of the line of intersection VI—VI in FIG. 5, the placement of a chip unit 58 in the substrate recess 56, wherein terminal areas 59 of the chip unit 58 are caused to abut the initial coil region 51 and the final coil region 52.

FIG. 7 shows the subsequent connection of the terminal areas 59 of the chip unit 58 to the initial coil region 51 and to the final coil region 52 by means of a thermode 60 which under the influence of pressure and temperature creates a connection by material closure between the wire conductor 20 and the terminal areas 59, as an overall result of which a card module 64 is formed.

In the case of the chip unit 58 represented in FIGS. 6 and 7 it may also be a question, as in all other remaining cases where mention is made of a chip unit, either of an individual chip or of a chip module which, for instance, comprises a chip which is contacted on a chip substrate or even a plurality of chips. Furthermore, the connection represented in FIGS. 6 and 7 between the coil 50 and the terminal areas 59 is not restricted to the connection to one chip but applies generally to the connection of electronic components comprising terminal areas 59 to the coil 50. In this case it may be also a question, for example, of capacitors.

Furthermore, it becomes clear from FIGS. 6 and 7 that the substrate recess 56 is so dimensioned that it substantially accepts the chip unit 58. With a view to simplifying the alignment of the terminal areas 59 of the chip unit 58 in the course of the placement of the chip unit 58 preceding the actual contacting, the chip unit 58 may be equipped on its contact side 61 comprising the terminal areas 59 with an alignment aid 62 which here is constructed in the manner of a bridge. The alignment aid 62 is dimensioned so as to correspond to the spacing a which the initial coil region 51 and the final coil region 52 have from one another in the region of the substrate recess 56 (FIG. 5).

FIG. 8 shows a production device 63 that serves for the manufacture of card modules 64 that are used as semi-finished products in the manufacture of chip cards. The card modules 64 manufactured by means of the production device 63 here have, by way of example, the structure represented in FIGS. 5, 6 and 7 with, in each instance, a coil 50 and a chip unit 58 arranged on a common substrate 55.

The production device 63 represented in FIG. 8 comprises five stations, namely a feed station 65, a wiring station 66, an assembly station 67 and a connection station 68 as well as an extraction station 69.

In the feed station there is supplied to the production device 63 a so-called yield 70 which exhibits in a common composite a plurality of substrates 55—here for representational reasons only twenty—which are connected to one another via points of separation which are not represented here in any detail. The yield 70 is supplied by means of a transport instrument 71 to the wiring station 66 which comprises at a portal 73, which extends transversely in relation to the production direction 72 and is capable of being displaced in the production direction 72, four identical wiring devices 22 arranged in a row. The wiring devices 22 are supplied with the wire conductor 20 via four wire-conductor coils 74. For the purpose of forming the coil configurations represented by way of example in FIG. 5, the wiring devices 22,, which are capable of being displaced along the portal 73, are displaced appropriately in the wiring plane 28 (FIG. 1).

After wiring of the wire conductors 20 corresponding to the coil configuration represented in FIG. 5, the yield 70 with the coils 50 formed thereon is moved on further to the assembly station 67. In the present case the connection station 68 is combined with the assembly station 67 in such a way that, on a portal 75 which is capable of being displaced in the production direction 72, both an assembly device 76 and a connecting device 77 are arranged so as to be capable in each instance of being displaced in the longitudinal direction of the portal 75. In this case the assembly device 76 serves for extraction of chip units 58 from a chip-unit reservoir 78 and for subsequent placement of the chip units 58 in the manner represented in FIG. 6. The connecting device 77 serves to bring the terminal areas 59 of the chip units 58 into contact with the coil 50, as represented in FIG. 7.

After assembly and contacting, the yield 70 is moved on further into the extraction station 69. Here an extraction of the yield 70 takes place with subsequent separation of the substrates 55, or firstly a separation of the substrates 55—that is to say, a dispersion of the composite yield—and subsequently the extraction of the individual substrates 55 which now take the form of card modules 64.

Figure 9:
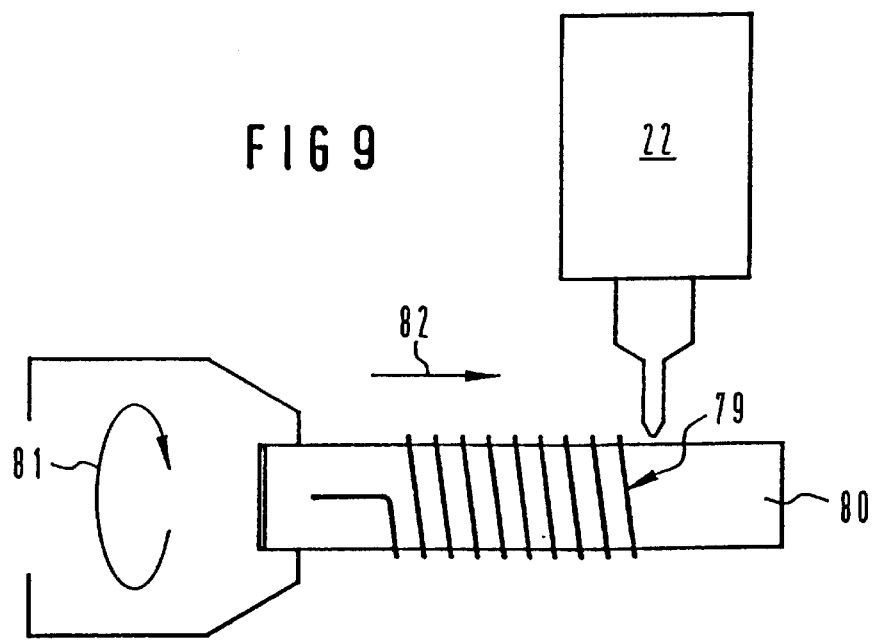
FIG. 9 the wiring of a wire conductor by means of ultrasound on a rotationally symmetrical winding form.

FIG. 9 shows a particular application of the process elucidated by way of example on the basis of FIG. 1 for the manufacture of a cylindrical formed coil 79 wherein the substrate takes the form of a cylindrical winding support 80 and the wiring or embedding of the wire conductor 20 on the winding support 80 is effected in the course of rotation 81 of the winding support 80 with simultaneous superimposed translation 82 of the wiring device 22.

Figure 10:
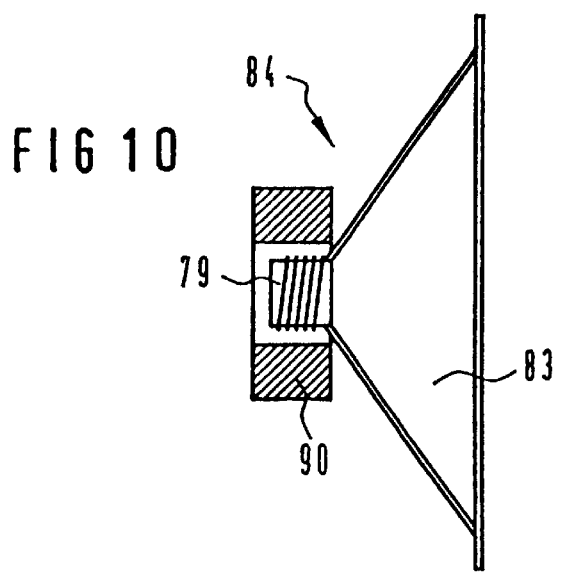
FIG. 10 a moving coil of a loudspeaker unit manufactured by means of ultrasonic wiring on a cylindrical winding form.

As FIG. 10 shows, the winding support 80 may also take the form of a cylindrical extension of a plastic vibrating diaphragm 83 of a loudspeaker unit 84, so that in the manner represented in FIG. 9 a moving coil 85 is capable of being manufactured such as serves, in combination with a permanent magnet indicated in FIG. 10, to form a loudspeaker unit 84.

Figure 11:
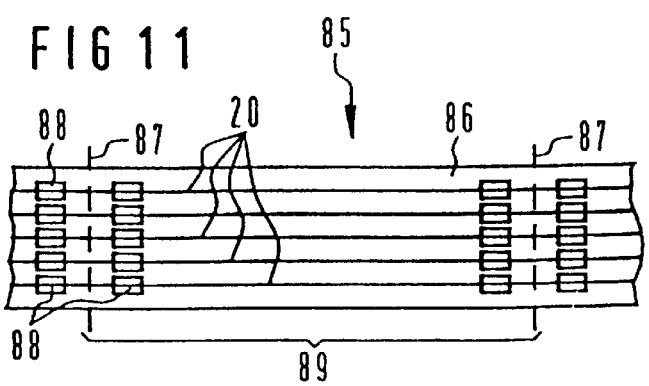
FIG. 11 a longitudinal-section representation of a ribbon cable equipped with wire conductors.

FIG. 11 shows, by way of another possible application of the process that has been described, a ribbon-cable section 85 with a substrate 86 taking the form of a ribbon cable which, adjoined on both sides by points of separation 87, is provided with substrate recesses 88 arranged in a row transverse to the longitudinal direction of the substrate 86. On the substrate 86 there are located, arranged parallel to one another and extending in the longitudinal direction of the substrate 86, a plurality of wire conductors 20 which are wired on the substrate 86 in the manner represented by way of example in FIG. 1. In this case the wire conductors 20 are guided away in the region of the points of separation 87 via the substrate recesses 88. The points of separation serve for the definition of predetermined ribbon-cable pieces 89, whereby the substrate recesses 88 are then arranged in each instance at one end of a piece of ribbon cable. In particularly favourable manner this results in contacting possibilities for connector plugs or connector sockets with the wire conductors 20 without the wire conductors having firstly to be exposed for this purpose. The substrate recesses 88 are introduced into the substrate 86 in a stamping process with an appropriately formed punch tool, whereby as a result of the spacing of the stampings the spacing of the points of separation 87 is preset. Subsequently the appropriately prepared continuous substrate is covered with the wire conductors 20, whereby in this case a number of wiring devices corresponding to the number of wire conductors 20 are arranged above the substrate which is moved longitudinally.

FIG. 12 shows, in a modification of the wiring device 22 represented in FIG. 3, a wiring device 91 which, like the wiring device 22, comprises an ultrasonic generator 34. As distinct from the wiring device 22, there is no wire guide fastened to the connection region 35 of the ultrasonic generator 34 but rather a vibrating punch 92 which, as represented in FIG. 12, serves to subject the wire conductor 20 which is guided between a profiled end 93 and the surface of the substrate 21 to the action of mechanical vibrations extending in the longitudinal direction of the vibrating punch 92 and induced by ultrasound. In order in this case to enable reliable guidance of the wire conductor 20, the profiled end 93 is provided with a concave recess which is not represented in FIG. 12 in any detail and which enables partial encompassing of the wire conductor 20.

As distinct from the wiring device 22 represented in FIG. 3, on the wiring device 91 a wire guide 94 is provided which, in the case of the embodiment example represented here, is formed from a guidance tube 95 arranged laterally on the ultrasonic generator 34 with an elbow nozzle 96 which is formed in the direction of the profiled end 93 and which enables lateral supply, here directed obliquely downwards, of the wire conductor 20 in the direction of the profiled end 93. Hence, as represented in FIG. 12, the wire conductor 20 can be guided between the profiled end 93 of the vibrating punch 92 and the surface of the substrate 21 in order to enable the previously described connection to, or alternatively wiring on, or in, the surface of the substrate 21.

Departing from the representation in FIG. 12, it is also possible to provide the wire guide on the wiring device 91, decoupled from the ultrasonic generator 34, in order where necessary to enable vibration-free supply of the wire conductor.

In the case of the embodiment example represented in FIG. 12 the wiring device comprises a wire coil 99 which is capable of rotating about a winding axis 98 arranged transverse to the punch axis 97 and which serves to supply the wire conductor 20 into the wire guide 95.

In order to enable arbitrary wiring of the wire conductor 20 on the surface of the substrate 21, the wiring device 91 comprises, coaxially with respect to the punch axis 97, a pivotal axis 100.

In the language of the present patent application the terms "wire-shaped conductor" and "wire conductor" generally designate conductors for the transmission of signals that have a defined longitudinal extent and therefore with respect to their external shape are of wire-shaped construction. However, the term "wire conductor" is not restricted to metallic conductors but also designates conductors made of other materials, for example light guides made of glass fibre, or even conductors that serve for the guidance of flowing media. Particularly in the case where the conductors used are provided with an adhesive surface it is also possible for the conductors to be disposed in multiple layers located on top of one another, the lowest layer being connected to the surface of the substrate and other layers being connected in each instance to conductor layers arranged below them. The adhesion may, for example, be obtained via a coating of the conductor with baking lacquer which with regard to its adhesive effect is capable of being activated by means of the action of heat, or via an appropriate plastic coating.

Figure 16:
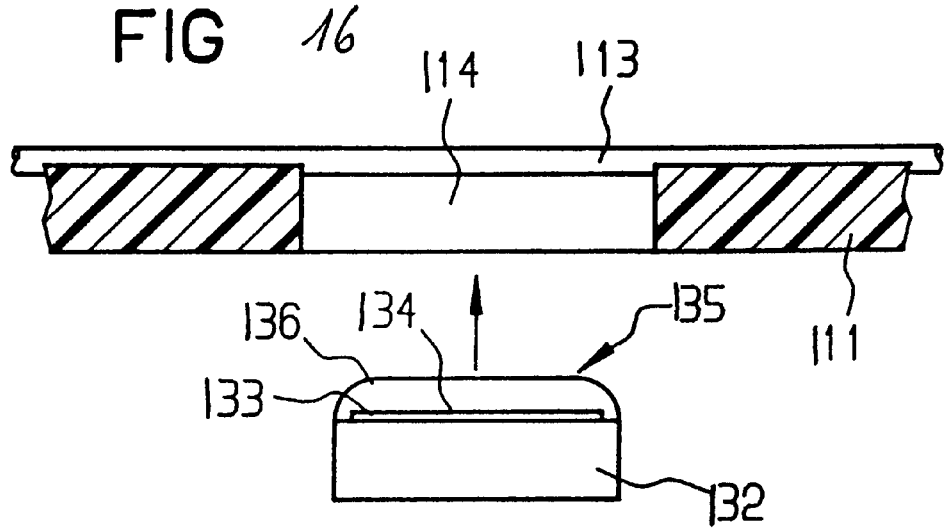
FIG. 16 is a representation corresponding in its view to FIG. 14 for the purpose of elucidating an alternative procedure with subsequent application of a chip unit.
Figure 17:
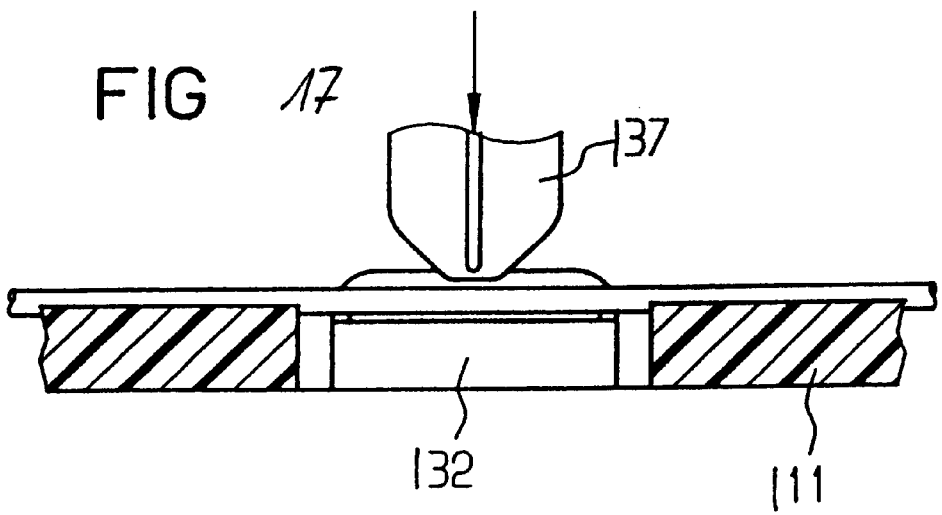
FIG. 17 is a view showing the contacting of the chip unit applied subsequently according to FIG. 17.

FIG. 13 a card inlet pertaining to a chip card with a transponder unit formed from a wire coil and a chip unit;

FIG. 14 a sectional representation of the card inlet represented in FIG. 13 according to the course of the line of intersection II—II, for the purpose of elucidating the manufacturing process;

FIG. 15 another sectional representation of the card inlet represented in FIG. 13 according to the course of the line of intersection III—III;

FIG. 16 a representation corresponding in its view to FIG. 14 for the purpose of elucidating an alternative procedure with subsequent application of a chip unit;

FIG. 17 the contacting of the chip unit applied subsequently according to FIG. 17;

FIG. 18 a possible contact metallisation of a terminal area of a chip with contacting according to the process represented in FIG. 17;

FIG. 19 another possible contact metallisation of a terminal area of a chip;

FIG. 20 a representation corresponding in its view to FIG. 14 of a transponder unit arranged on a coil substrate.

FIG. 13 shows a chip-card inlet 110 which, with a view to the manufacture of a chip card by way of end product which is not represented in any detail here, is provided with bilateral surface layers which as a rule are applied onto the chip-card inlet in the form of laminated layers covering the surface.

The chip-card inlet 110 consists here of a coil substrate 111 formed from plastic material, onto which a wire coil 112 is applied with the aid of wire-laying technology. To this end a wire conductor 113 is wired on the surface of the coil substrate 111 by means of a wiring instrument which is not represented in any detail in FIG. 13 and is partially embedded into the coil substrate 111 by ultrasonic loading, as can be gathered from FIG. 14.

As is evident furthermore from the representation according to FIG. 13, in the coil substrate 111 a recess 114 is provided which serves to accept a chip unit constituted here by an individual chip 115. The chip unit may, as in the present case, be constituted merely by the chip 115. However, it is further possible for the chip unit to be formed from a so-called "chip module" which accepts one or even several cased chips.

As is further evident from FIG. 13, the wire conductor 113 which is wired for the purpose of forming the wire coil 112 on the coil substrate 111 is contacted with wire ends 116, 117 on an assigned terminal area 118 and 119, respectively, of the chip 115.

A process for implementing the contacting of the wire ends 116, 117 with the terminal areas 118, 119 of the chip 115 will be elucidated in more detail below with reference to FIG. 14. The process represented in detail in FIG. 14 is effected in two successive phases, which here for the purpose of differentiation are denoted by I and II. In the phase designated by I the wire end 116 illustrated here is fixed on the coil substrate 111, whereby simultaneously as a consequence of the aforementioned wiring process for applying the wire conductor 113 onto the surface of the coil substrate 111 the wire conductor 113 is guided away via the chip 115 that is received in the recess 114. With a view to implementing the process represented in FIG. 14, the coil substrate 111 is arranged on a table 120 together with the chip 115 received in the recess 114.

By way of wiring instrument, in the case of the process example represented in FIG. 14 use is made of an ultrasonic instrument 121 which with a vibrating punch 122 embeds the wire conductor 113 which is continuously guided out of a wire guide 123 into the surface of the coil substrate 111 and thereby simultaneously executes a horizontal movement 124 on the surface of the coil substrate 111. This application of the wire conductor 113 on the surface of the coil substrate 111, which is described by the term wirings, is firstly effected in the region designated by Ia to the left of the recess 114, subsequently the wire conductor 113 is guided away with the wire guide 123 via the chip 115 which is arranged in the recess 114, in order finally to continue with the fixation of the wire conductor 113 on the right-hand side of the recess 114 in the region headed by Ib by means of ultrasonic loading of the wire conductor via the vibrating punch 122. Although when use is made of the ultrasonic instrument 121 described above for wiring the wire conductor 113 on the coil substrate 111 a fixation of said wire conductor arises extending substantially over the entire length of the wire conductor 113 on the coil substrate 111, in order to realise the principle of the process it is sufficient if a fixation of the wire conductor 113 on the coil substrate 111 is effected merely at two points to the left and right of the recess 114, in order to achieve the linear alignment of the wire conductor 113 represented in FIG. 14 via the terminal areas 118, 119 of the chip 115.

After the wire conductor 113 is located in the position spanning the assigned terminal area 118 of the chip 115, in the phase denoted by II the connection of the wire conductor 113 to the terminal area 118 is effected. To this end use is made, in the process example represented in FIG. 14, of another ultrasonic instrument 125 which, as is evident in particular from FIG. 15, comprises a profiled end 126 pertaining to a vibrating punch 127 and provided with a concave recess.

The process described above with reference to FIGS. 14 and 15 also offers the possibility, by appropriate choice of the points of fixation of the wire conductor on the substrate, of guiding the wire conductor away diagonally via the terminal areas, in order to increase the overlap between the wire conductor and the terminal areas. Also, several chips or other elements arranged in series on, or in, a substrate can be connected by means of the wire conductor in the manner represented in FIG. 14.

Furthermore, FIG. 15 shows clearly that, in contrast with the vibrational loading 128 induced by ultrasound which is effected in the longitudinal direction of the vibrating punch 122 of the ultrasonic instrument 121, the vibrational loading 129 of the vibrating punch 127 induced by ultrasound is effected transverse to the longitudinal direction of the wire conductor 113 and parallel to the surface of the coil substrate 111. On this vibrational loading 128 a slight contact pressure 130 is superimposed, so that the wire conductor 113 which is received in guided manner in the profiled end 126 of the vibrating punch 127 is moved back and forth in oscillating manner under pressure in the region of the terminal area 118 above the latter. On the one hand this results in any oxide skins that may be present on the terminal area 118 being ripped open and eroded, on the other hand a welding subsequently results, given appropriately high or increased contact pressure 130, of the wire conductor 113, which here is formed from copper, to the aluminium terminal area 118. In case the wire conductor 113 is provided with an external insulation the latter can also be removed by the oscillating movement back and forth in the region of the terminal area 118, so that subsequently the metallic connection previously described between the wire conductor, which immediately beforehand is still protected against oxidation by the insulation, and the terminal area becomes possible.

In the coil substrate 111 represented in FIGS. 14 and 15 the recess 114 is arranged so as to be larger than the corresponding dimensions of the chip 15, so that a circumferential gap 130 results between the chip 115 and the edges of the recess 114. By this means a virtually "floating acceptance" of the chip 115 in the recess 114 is possible, whereby, although said chip is substantially defined in its location relative to the coil substrate 111, it is able to execute minor relative movements. This results in the advantage that, by virtue of the laminating operation described in the introduction for application of the bilateral surface layers onto the coil substrate 111, the chip can at least partially avoid the pressure loads associated with the laminating operation and consequently the risk of damage to the chip in the course of the laminating operation is significantly reduced.

In order also in the case of the "floating acceptance" of the chip in the recess 114 described above to be able to carry out an exact positioning of the wire conductor 113 on the terminal area 118, the wire conductor 113 can be tracked via a corresponding transverse-movement axis 131 of the ultrasonic instrument 125.

Although with reference to the process example represented in FIGS. 14 and 15 two different ultrasonic instruments 121 and 125 were mentioned in the foregoing description, there is also the possibility, given appropriate design of the ultrasonic instrument 121, of making use of the latter both for the wiring and/or fixation of the wire conductor on the surface of the coil substrate 111 and for the connection of the wire conductor 113 to the respectively assigned terminal area 118 or 119.

A way of proceeding that is slightly varied in comparison with FIGS. 14 and 15 is represented in FIGS. 16 and 17, wherein only after fixation of the wire conductor 113 on the surface of the coil substrate 111 on both sides of the recess 114 is a chip 132 introduced into said recess. In order simultaneously with the introduction of the chip 132 into the recess 114 to enable a positioning that is suitable for the subsequent contacting of the wire conductor 113 with an assigned terminal area 133 of the chip 132, the latter is equipped on its contact side 134 with bridge-type alignment aids 135, in each instance arranged adjacent to a terminal area 133, which provide for correct relative positioning via guide bevels 136.

FIG. 17 shows, in addition, a thermode instrument 137 which can be employed as an alternative to the ultrasonic instrument 125 by way of a connecting instrument which enables a connection of the wire conductor under pressure and temperature loading to the assigned terminal area 133. With both of the connection processes represented in FIGS. 14, 15 and 17 there is, in principle, the possibility of establishing the connection between the wire conductor and the terminal areas by a superimposition of ultrasonic loading and temperature loading, for example by means of a heatable ultrasonic instrument.

In order to enable a connection of the copper wire conductor 113 to the aluminium terminal areas 133 of the chip 132, the terminal areas 133 are provided with a contact metallisation 138 (FIG. 18) or 139 (FIG. 19). The contact metallisations 138, 139 comprise, in corresponding manner, a zincate layer serving as intermediate layer 140 which serves as foundation for a nickel layer 141 applied to it in the case of the contact metallisation 138, or a palladium layer 142 in the case of the contact metallisation 139. With a view to improving the connecting capacity or with a view to increasing the oxidation resistance, the nickel layer 141 is also provided with a gold coating 145. For the purpose of clarifying the size dimensions, layer thicknesses of the layers that are applied to the aluminium coating, about 1 to 2 µm in thickness, of the terminal area 133 are given below by way of examples:

| zincate layer: | d = 150 nm; |
|---|---|
| nickel layer: | d = 1–5 µm; |
| palladium layer: | d = 1–5 µm; |
| gold coating: | d = 100–150 nm. |

FIG. 20 finally shows, in a variant of the representation according to FIG. 13, the possibility of applying the process described above also for the direct contacting of the wire conductor 113 with assigned terminal areas 118 and 119 of the chip 115 if the chip 115 is not arranged in a recess but rather on the surface of a substrate 143. In the case of the substrate 143 represented in FIG. 20 it may be a question, for example, of a paper substrate or of any other substrate. Conforming with the process elucidated with reference to FIGS. 14 and 15, here too on both sides of an acceptance region or arrangement region 144 for the chip 115 a fixation is provided of the wire conductor 113 into the surface regions of the substrate 143, here designated in simplified manner by Ia and Ib.

In particular on account of the particularly thinly formed substrate the embodiment represented in FIG. 20 appears to be particularly suitable for use as a transponder arrangement in connection with the identification of luggage. Although in the foregoing embodiment examples reference is made, with a view to elucidating the process, to transponder units consisting of a coreless wire coil and a chip unit, use may of course also be made of ferrite-core coils such as are employed, for example, for the manufacture of animal transponders.

In any case, the chip or the chip unit can be made thinner prior to or after the application on, or in, the substrate, in order to-increase the flexibility of the chip and, where appropriate, to adapt the chip to the substrate as regards its bending behaviour.

While specific embodiments of the invention have been shown and described in detail to illustrate the application of the principles of the invention, it will be understood that the invention may be embodied otherwise without departing from such principles.

What is claimed is:

1. A process for the contacting of a wire conductor in the course of the manufacture of a transponder unit arranged on a coil substrate and including a wire coil with wire windings for forming the wire coil on a surface plane of the substrate and a chip unit having a terminal area, the process comprising the steps of in a first phase guiding the wire conductor over and away from a terminal area or a region accepting the terminal area and fixing the wire conductor on the substrate relative to the terminal area or the region assigned to the terminal area; and in a second phase effecting a connection of the wire conductor to the terminal area with a connecting instrument and the wire conductor is connected while being fixed on the coil substrate and extending in parallel to the surface plane of the windings of the wire coil.

2. The process according to claim 1, wherein an ultrasonic instrument is used as the connecting instrument for the purpose of connecting the wire conductor to the terminal area.

3. The process according to claim 1, wherein an ultrasonic instrument is used both as the connecting instrument for the purpose of connecting the wire conductor to the terminal area and for the purpose of arranging the wire coil on the substrate.

4. The process according to claim 1, wherein the arrangement of the wire coil on the substrate of the wire conductor is effected by means of a wiring device taking the form of an ultrasonic instrument in such a way that the wire conductor is subjected to the action of ultrasound in a direction transverse to the wiring plane and the transverse movement of the wiring device generated by the ultrasonic loading is superimposed on the wiring movement extending in the wiring plane.

5. The process according to claim 1, wherein the transverse movement takes place along a transverse-movement axis that is variable as regards its angle in relation to the axis of the wiring movement.

6. A The process according to claim 4, wherein the ultrasonic frequency and/or the angle between the axis of the wiring movement and the transverse movement axis is varied as a function of the desired depth of penetration of the wire conductor.

7. The process according to claim 1, further comprising guiding away, via a substrate recess, a final coil region and an initial coil region of a coil which is formed on the substrate by the wiring.

8. The process according to claim 7, wherein ultrasonic loading of the wire conductor is interrupted in the region of the substrate recess.

9. The process according to claim 4, for the purpose of crossing a wire section that has already been wired the ultrasonic loading of the wire conductor is interrupted in the crossing region and the wire conductor is guided in a crossing plane that is spaced in relation to the wiring plane.

10. The process according to claim 1, wherein the chip unit is connected to the coil, whereby in a wiring phase the coil having an initial coil region and a final coil region is formed on the substrate by means of a wiring device and in a subsequent connection phase a connection is implemented between the initial coil region and the final coil region to terminal areas of the chip unit by means of a connecting device.

11. The process according to claim 10, wherein the substrate consists of a fleece-type material, including one of paper or cardboard, and the connection which is made in the course of the wiring is effected by means of a layer of adhesive disposed between the wire conductor and a surface of the substrate.

12. The process according to claim 10, wherein the connection of the initial coil region and of the final coil region to the terminal areas of the chip unit is effected by means of a thermocompression process.

13. The process according to claim 10, wherein a manufacture of a plurality of card modules takes place simultaneously in such a way that in a supply phase a plurality of substrates combine to form a yield and are supplied to a production device comprising a plurality of wiring devices and connecting devices, subsequently in the wiring phase a plurality of coils are formed simultaneously on substrates arranged in a row, then in the connection phase a plurality of chip units are connected via their terminal areas to the coils, and finally in a separation phase a separation of the card modules from the composite yield takes place.

14. The process according to claim 1, wherein a rotationally symmetrical coil is formed with a wire conductor wired on a substrate taking the form of a winding support and rotating relative to a wiring device.

15. The process according to claim 14, further comprising providing a vibrating diaphragm wherein the rotationally symmetrical coil is provided for the manufacture of a moving coil of a loudspeaker unit which is integrally connected to the vibrating diaphragm.

16. The process according to claim 1, wherein a number of wiring devices corresponding to the number of cable conductors desired are arranged transverse to the longitudinal axis of a ribbon-shaped substrate and a relative movement between the substrate and the wiring devices takes place in the direction of the longitudinal axis of the substrate.

17. The process according to claim 1, further comprising a preparatory treatment of an aluminum surface of the terminal area prior to the connection of the wire conductor to the terminal area.

18. The process according to claim 17, wherein with a view to the preparatory treatment a mechanical elimination of of an oxide layer disposed on the aluminum surface is effected by subjecting the terminal area to the action of an ultrasonic instrument.

19. The process according to claim 17, wherein with a view to the preparatory treatment the aluminum surface is subjected to a cleansing process.

20. The process according to claim 19, wherein the cleansing process includes at least one of a dry-etching process, a wet-etching process or a laser treatment of the aluminum surface.

21. The process according to claim 17, with a view to preparatory treatment the aluminum surface is provided with a multilayered contact metallization having a zincate layer which is applied by way of intermediate layer onto the aluminum face and having an interconnect layer which is provided for the contacting with the wire conductor.

22. The process according to claim 21, wherein the interconnect layer takes the form of a layer comprising one of nickel or palladium.

23. The process according to claim 4, wherein a vibrational loading of the wire conductor brought about by ultrasound takes place in a plane substantially parallel to the terminal area and transverse to the longitudinal axis of the wire conductor.

24. The process according to claim 23, wherein a vibrational loading of the wire conductor brought about by ultrasound serves for regional removal of a wire-conductor insulation.

25. The process according to claim 1, wherein a fixation of the wire conductor is effected on a plastic support sheet which together with the wire conductor and the chip forms a card inlet for the manufacture of a chip card.

26. The process according to claim 25, wherein a fixation of the wire conductor on the plastic support sheet and the connection of the wire conductor to the terminal areas of the chip serves to form a mechanical suspension of the chip on the plastic support sheet.

27. The process according to claim 1, the fixation of the wire conductor is effected by wiring with a wiring device comprising an ultrasonic instrument.

28. The process according to claim 25, wherein the ultrasonic instrument for the wiring of the wire conductor on the support sheet brings about a vibrational loading of the wire conductor transverse to the longitudinal axis of the wire conductor and transverse to the surface of the support sheet, and the ultrasonic instrument for the connection of the wire conductor to the terminal area brings about a vibrational loading of the wire conductor in a plane substantially parallel to the support sheet and transverse to the longitudinal axis of the wire conductor.

29. A process for contacting of a wire conductor arranged on a substrate and including a wire coil and a chip unit, the process comprising:

a first phase in which the wire conductor is guided away via a terminal area or a region accepting the terminal area and is fixed on the substrate relative to the terminal area or the region assigned to the terminal area;

a second phase in which the connection of the wire conductor to the terminal area is effected with a connecting instrument, the device comprising;

using a wire guide;

using an ultrasonic generator, the ultrasonic generator being connected to the wire guide in such a way that the wire guide is stimulated to execute ultrasonic vibrations in the direction of the longitudinal axis;

providing a yield supply station for supplying a plurality of substrates arranged in a yield;

providing a wiring station with a plurality of wiring devices arranged in a row transverse to a production direction;

providing an assembly station with at least one assembly device for equipping the individual substrates with a chip unit; and providing a connection station with at least one connecting device for connecting the chip units to an initial coil region and to a final coil region of the coils which are formed on the substrates by the wiring devices.

30. A process for arranging a wire conductor on a substrate to form a wire coil connected to a chip unit, the process comprising the steps of:

providing the substrate with a recess for receiving the chip unit;

inserting the chip unit into said recess;

guiding the wire conductor over said recess with said inserted chip and away from said recess with a wire guiding device;

subsequent to said step of guiding the wire conductor, fixing the wire conductor to the substrate by ultrasonically vibrating the wire guiding device and the wire conductor during said fixing, said guiding and said fixing including forming the wire coil from the wire conductor;

subsequent to said step of fixing the wire conductor, connecting the wire conductor to a terminal area, fixed to the substrate and of the chip unit with the wire conductor connected to the terminal area extending in parallel to the surface plane of the windings of the wire coil.

31. The process in accordance with claim 30, wherein:

said inserting of the chip unit into said recess is performed after said guiding and said fixing.

32. The process in accordance with claim 30, wherein:

said recess extends through said substrate;

said fixing of the wire conductor is on one side of the substrate and said inserting of the chip unit is from another opposite side of the substrate.

33. The process in accordance with claim 31, wherein:

said recess extends through said substrate;

said fixing of the wire conductor is on one side of the substrate and said inserting of the chip unit is from another opposite side of the substrate.

* * * * *

UNITED STATES PATENT AND TRADEMARK OFFICE
CERTIFICATE OF CORRECTION

PATENT NO. : 6,233,818 B1
DATED : May 22, 2001
INVENTOR(S) : Finn et al.

Page 1 of 1

It is certified that error appears in the above-identified patent and that said Letters Patent is hereby corrected as shown below:

<u>Title page,</u>
Item [76], Inventors: David Finn, Steigmuehenweg 16A, D-87629 Fuessen-Weissensee (De); Manfred Rietzler, Am Alsterberg 10, D-87616 Marktoberdorf (DE)

Signed and Sealed this

Twenty-fifth Day of December, 2001

Attest:

JAMES E. ROGAN
*Attesting Officer*  *Director of the United States Patent and Trademark Office*

UNITED STATES PATENT AND TRADEMARK OFFICE
CERTIFICATE OF CORRECTION

PATENT NO. : 6,233,818 C1  Page 1 of 2
APPLICATION NO. : 90/008799
DATED : February 17, 2009
INVENTOR(S) : Finn et al.

It is certified that error appears in the above-identified patent and that said Letters Patent is hereby corrected as shown below:

Title page Item (56)
On page one, under "Other Publications," please add the following art:

IRELAND: Aontec Teoranta's Petition for Invalidity, together with related Particulars of Objection, filed against EP 0 880 754-IE (The High Court, 2008 No. 1 PAP) (6 pages total).

UNITED KINGDOM: Aontec Teoranta's Claim Form against Smartrac's European Patents (UK) No. 0 880 754 and 0 753 180, along with the Amended Particulars of Claim filed on 11/22/2007 (High Court of Justice Chancery Division Patents Court, Claim No. HC07CO3177, Issue Date: 11/22/2007) (11 pages total).

GERMANY: Translation of Minutes of Oral Proceedings of 12 August 2008 Before the Federal Patent Court, 2 NI 7/07 (EU) (7 pages total).

GERMANY: Translation of Aontec's Brief to Federal Patent Court of 12 June 2008 2 NI 7/07 (17 total pages).

GERMANY: Letter dated 10/18/1995 from Peter Tomasino (AIT) to Etienne Verloes with enclosures regarding AIT's planar coil manufacturing technology (8 total pages).

GERMANY: Letter dated 10/18/1995 from Peter Tomasino (AIT) to Etienne Verloes (1 total page).

GERMANY: Translation of the Brief of Aontec dated August 5, 2008 to the Federal Patent Court (17 total pages).

GERMANY: Affidavit of Etienne Verloes, dated January 7, 2008, including Exhibits 1-4 (13 total pages).

Signed and Sealed this
Third Day of May, 2011

David J. Kappos
*Director of the United States Patent and Trademark Office*

On page one, under "Other Publications," please add the following art:

GERMANY: Affidavit of Raymond Keogh, including Annexes A-C (12 total pages).

GERMANY: Affidavit of Joseph Hammond, including Annexes A-D (12 total pages).

GERMANY: Translations of Exhibits from Affidavit of Etienne Verloes, dated January 7, 2008 (6 total pages).

(12) EX PARTE REEXAMINATION CERTIFICATE (6663rd)

United States Patent
Finn et al.

(10) Number: US 6,233,818 C1
(45) Certificate Issued: Feb. 17, 2009

(54) METHOD AND DEVICE FOR BONDING A WIRE CONDUCTOR

(75) Inventors: David Finn, Fuessen-Weissensee (DE); Manfred Rietzler, Marktoberdorf (DE)

(73) Assignee: Smartrac IP B.V., Amsterdam (NL)

Reexamination Request:
No. 90/008,799, Sep. 4, 2007

Reexamination Certificate for:
Patent No.: 6,233,818
Issued: May 22, 2001
Appl. No.: 09/117,970
Filed: Aug. 7, 1998

Certificate of Correction issued Dec. 25, 2001.

(22) PCT Filed: Feb. 12, 1997
(86) PCT No.: PCT/DE97/00261
§ 371 (c)(1),
(2), (4) Date: Aug. 7, 1998
(87) PCT Pub. No.: WO97/30418
PCT Pub. Date: Aug. 21, 1997

(30) Foreign Application Priority Data

| Feb. 12, 1996 | (DE) | 196 04 840 |
| May 20, 1996 | (DE) | 196 20 242 |
| May 17, 1996 | (DE) | 196 19 771 |

(51) Int. Cl.
*H05K 3/00* (2006.01)

(52) U.S. Cl. ............... 29/843; 29/600; 29/827; 235/382
(58) Field of Classification Search ............. None
See application file for complete search history.

(56) References Cited

U.S. PATENT DOCUMENTS

| 3,444,612 A | 5/1969 | Pennings |
| 3,459,355 A | 8/1969 | Metzger, Jr. |
| 3,483,611 A | 12/1969 | Balamuth et al. |
| 3,526,554 A | 9/1970 | Obeda |
| 3,580,460 A | 5/1971 | Lipschutz ............ 228/4 |
| 3,628,716 A | 12/1971 | Fastre |
| 3,646,307 A | 2/1972 | Hazel ............ 219/80 |
| 3,674,602 A | 7/1972 | Keogh et al. |
| 3,674,914 A | 7/1972 | Burr |
| 3,822,465 A | 7/1974 | Frankort et al. ............ 29/470.1 |

(Continued)

FOREIGN PATENT DOCUMENTS

| CN | 1111035 A | 11/1995 |
| DE | 32 47 344 | 7/1983 |
| DE | 3624630 A1 | 2/1987 |
| DE | 40 16 720 A1 | 2/1991 |
| DE | 42 05 084 A1 | 9/1993 |

(Continued)

OTHER PUBLICATIONS

Germany: "Advanced Interconnection Technology, Inc., Coil Manufacturing Technology," Dated Sep. 1995 (6 total pages).
Germany: "Antenne Spirales RFID Avec Micro–Fil Enrobé Dans Le Support," Advanced Interconnection Technology (no date given) (2 total pages).

(Continued)

*Primary Examiner*—Joseph A. Kaufman

(57) ABSTRACT

Process and device for the contacting of a wire conductor (113) in the course of the manufacture of a transponder unit arranged on a substrate (111) and comprising a wire coil (112) and a chip unit (115), wherein in a first phase the wire conductor (113) is guided away via the terminal area (118, 119) or a region accepting the terminal area and is fixed on the substrate (111) relative to the terminal area (118, 119) or the region assigned to the terminal area, and in a second phase the connection of the wire conductor (113) to the terminal area (118,119) is effected by means of a connecting instrument (125).

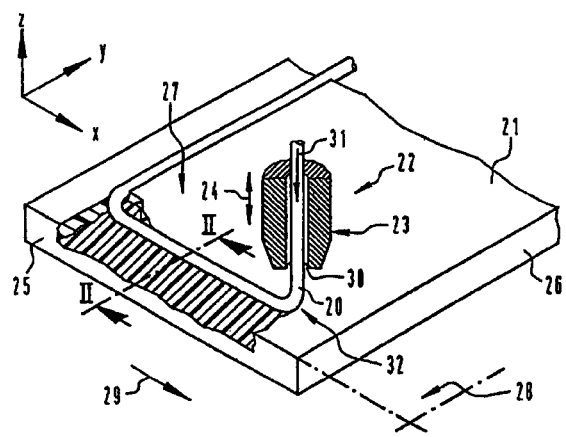

U.S. PATENT DOCUMENTS

| | | |
|---|---|---|
| 3,827,619 A | 8/1974 | Cusick et al. .................. 228/1 |
| 3,890,753 A | 6/1975 | Cusick et al. ............... 73/88 B |
| 3,981,076 A | 9/1976 | Nicolas |
| 4,065,850 A | 1/1978 | Burr et al. |
| 4,069,961 A | 1/1978 | Nicklaus et al. ............. 228/1 R |
| 4,213,556 A | 7/1980 | Persson et al. ............. 228/104 |
| 4,369,557 A | 1/1983 | Vandebult .................. 29/25.42 |
| 4,417,413 A | 11/1983 | Hoppe et al. |
| 4,450,623 A | 5/1984 | Burr ........................... 29/850 |
| 4,485,957 A | 12/1984 | Sugimoto et al. ............ 228/4.5 |
| 4,611,392 A | 9/1986 | Bell ......................... 29/602 R |
| 4,697,058 A | 9/1987 | Mueller .................. 219/56.21 |
| 4,712,723 A | 12/1987 | Moll et al. .................. 228/111 |
| 4,776,509 A | 10/1988 | Pitts et al. |
| 4,781,319 A | 11/1988 | Deubzer et al. ............. 228/4.5 |
| 4,857,893 A | 8/1989 | Carroll ....................... 340/572 |
| 4,860,344 A | 8/1989 | Jans et al. .................... 379/113 |
| 4,925,085 A | 5/1990 | Buxton ....................... 228/179 |
| 4,958,762 A | 9/1990 | Shimizu et al. ............. 228/1.1 |
| 4,976,392 A | 12/1990 | Smith et al. ................. 228/102 |
| 5,060,841 A | 10/1991 | Oshima et al. ............. 228/102 |
| 5,227,659 A | 7/1993 | Hubbard .................... 257/531 |
| 5,240,166 A | 8/1993 | Fontana et al. |
| 5,281,855 A | 1/1994 | Hadden et al. ............. 257/784 |
| 5,326,014 A | 7/1994 | Morita et al. ........... 228/110.1 |
| 5,365,657 A | 11/1994 | Brown et al. ................. 29/850 |
| 5,396,101 A | 3/1995 | Shiga ......................... 257/531 |
| 5,444,223 A | 8/1995 | Blama ....................... 235/435 |
| 5,448,110 A | 9/1995 | Tuttle et al. |
| 5,452,838 A | 9/1995 | Farassat ..................... 228/1.1 |
| 5,541,399 A | 7/1996 | de Vall ....................... 235/491 |
| 5,566,441 A | 10/1996 | Marsh et al. ................. 29/600 |
| 5,574,470 A | 11/1996 | de Vall ....................... 343/895 |
| 5,598,032 A | 1/1997 | Fidalgo ..................... 257/679 |
| 5,606,488 A | 2/1997 | Gustafson .................. 361/782 |
| 5,608,417 A | 3/1997 | de Vall ....................... 343/895 |
| 5,667,130 A | 9/1997 | Morita et al. ........... 228/110.1 |
| 5,705,852 A | 1/1998 | Orihara et al. ............. 257/679 |
| 5,741,392 A | 4/1998 | Droz |
| 5,745,988 A | 5/1998 | Hohmann et al. ............. 29/841 |
| 5,756,986 A | 5/1998 | Gustafson .................. 235/492 |
| 5,770,807 A | 6/1998 | Finn et al. ............. 73/862.541 |
| 5,817,207 A | 10/1998 | Leighton .................... 156/298 |
| 6,023,837 A | 2/2000 | Finn .......................... 29/566.1 |
| 6,055,720 A | 5/2000 | Finn et al. ..................... 29/605 |
| 6,067,235 A | 5/2000 | Finn et al. ................... 361/814 |
| 6,088,230 A | 7/2000 | Finn et al. ................... 361/737 |
| 6,142,381 A | 11/2000 | Finn et al. ................... 235/492 |
| 6,152,348 A | 11/2000 | Finn et al. ..................... 228/41 |
| 6,214,155 B1 | 4/2001 | Leighton .................... 156/298 |
| 6,310,778 B1 | 10/2001 | Finn et al. ................... 361/737 |
| 6,698,089 B2 | 3/2004 | Finn et al. ..................... 29/748 |

FOREIGN PATENT DOCUMENTS

| | | |
|---|---|---|
| DE | 42 20 194 | 12/1993 |
| DE | 43 07 064 A1 | 9/1994 |
| DE | 43 07 080 | 9/1994 |
| DE | 43 07 162 | 9/1994 |
| DE | 43 11 493 | 10/1994 |
| DE | 43 25 334 A1 | 12/1994 |
| DE | 43 29 708 | 3/1995 |
| DE | 43 32 055 | 3/1995 |
| DE | 44 10 733 | 5/1995 |
| DE | 44 08 124 A1 | 9/1995 |
| DE | 44 10 732 A1 | 10/1995 |
| DE | 44 216 07 A1 | 1/1996 |
| DE | 44 46 289 | 6/1996 |
| DE | 195 25 933 | 1/1997 |
| DE | 195 41 039 | 5/1997 |
| DE | 196 197 71 | 8/1997 |
| EP | 0 217 019 | 4/1987 |
| EP | 0 211 439 A2 | 9/1987 |
| EP | 0 615 285 A2 | 9/1994 |
| EP | 0 671 705 A2 | 9/1995 |
| EP | 0 880 754 B1 | 2/1997 |
| GB | 2 177 528 A | 1/1987 |
| GB | 2 180 408 | 3/1987 |
| JP | 61-174732 | 9/1986 |
| JP | 62-8313 | 1/1987 |
| JP | 62-156828 | 7/1987 |
| JP | 63-51194 | 3/1988 |
| JP | 02-094646 | 4/1990 |
| JP | 4-167719 | 6/1992 |
| JP | 6-163627 | 6/1994 |
| JP | 1995-335359 | 12/1995 |
| WO | 91/16718 | 10/1991 |
| WO | 93/09551 | 5/1993 |
| WO | 93/18493 | 9/1993 |
| WO | 93/20537 | 10/1993 |
| WO | 95/26538 | 10/1995 |

OTHER PUBLICATIONS

Germany: Infineon Security Packaging Center Introduction of MCC8–2–2, Oct. 2005 (5 total pages).

Germany: Hermann G., Egerer K. 1991 Band 2: Neue Verfahren, Neue Technologien Handbuch der Leiterplantentechnik, vol. 2, pp. 139–162 (25 total pages).

Germany: Hermann G., Egerer K. 3$^{rd}$ Edition 1993 Band 2: Neue Verfahren, Neue Technologien Handbuch der Leiterplatentechnik, vol. 2, pp. 284–312 (29 total pages).

Germany: AIT Information Sheet (no title) (no date) (2 pages total).

Germany: AIT's Embedded Wire Technlogy (no date) (1 page total).

Bruch, Herbert et al., "Leiterplatten, Herstellung und Verarbeitung, Advanced Technology," (1978), including English Translations of Section 13.3 (Producing the Mother Board) and Section 13.5 (Procedural Progression) (36 total pages).

Keogh, R.S. "Automated Fabrication of High Precision Planar Coils", Electrical Electronics Insulation Conference and Electrical Manufacturing and Coil Winding Conference, Sep. 18–21, 1995.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 4–6 and 9 are determined to be patentable as amended.

Claims 2, 3, 7, 8, 10–13, 23 and 25–27, dependent on an amended claim, are determined to be patentable.

New claims 34 and 35 are added and determined to be patentable.

Claims 14–22, 24 and 28–33 were not reexamined.

1. A process for the contacting of a wire conductor in the course of the manufacture of a transponder unit arranged on a coil substrate and including a wire coil with wire windings for forming the wire coil on a surface plane of the substrate and a chip unit having a terminal area, the process comprising the steps of
   in a first phase guiding the wire conductor over and away from [a] *the* terminal area *of the chip unit* or a region *formed in the substrate* accepting the [terminal area] *chip unit having the terminal area* and fixing the wire conductor [on] *onto* the substrate relative to the terminal area or the region [assigned to the terminal area] *accepting the chip unit, the wire conductor being unconnected to the terminal area or the region accepting the chip unit*; and
   in a second phase effecting a *direct* connection of the wire conductor to the terminal area *of the chip unit, wherein the chip unit is disposed on the substrate or in the region accepting the chip unit*, with a connecting instrument [and] *such that* the wire conductor is connected *to the terminal area* while *the wire conductor is* [being] fixed on the [coil] substrate and extending in parallel to the surface plane of the windings of the wire coil.

4. The process according to claim 1, wherein the arrangement of the wire coil on the substrate of the wire conductor is effected by means of a wiring device taking the form of an ultrasonic instrument in such a way that the wire conductor is subjected to the action of ultrasound in a direction transverse to [the] *a* wiring plane and the transverse movement of the wiring device generated by [the] ultrasonic loading is superimposed on [the] *a* wiring movement extending in the wiring plane.

5. The process according to claim [1] *4*, wherein the transverse movement takes place along a transverse-movement axis that is variable as regards its angle in relation to the axis of the wiring movement.

6. The process according to claim [4] *5*, wherein the ultrasonic frequency and/or the angle between the axis of the wiring movement and the transverse movement axis is varied as a function of the desired depth of penetration of the wire conductor.

9. The process according to claim 4, for the purpose of crossing a wire section that has already been wired the ultrasonic loading of the wire conductor is interrupted in [the] *a* crossing region and the wire conductor is guided in a crossing plane that is spaced in relation to the wiring plane.

*34. A process for the contacting of a wire conductor in the course of the manufacture of a transponder unit arranged on a coil substrate and including a wire coil with wire windings for forming the wire coil on a surface plane of the substrate and a chip unit having a terminal area, the process comprising the steps of*
   *in a first phase guiding the wire conductor over and away from the terminal area of the chip unit and fixing the wire conductor onto the substrate relative to the terminal area, the wire conductor being unconnected to the terminal area or a region accepting the chip unit; and*
   *in a second phase effecting a direct connection of the wire conductor to the terminal area, wherein the chip unit is disposed on the substrate or in a region accepting the chip unit, with a connecting instrument such that the wire conductor is connected to the terminal area while the wire conductor is fixed on the substrate and extending in parallel to the surface plane of the windings of the wire coil.*

*35. A process for the contacting of a wire conductor in the course of the manufacture of a transponder unit arranged on a coil substrate and including a wire coil with wire windings for forming the wire coil on a surface plane of the substrate and a chip unit having a terminal area, the process comprising the steps of*
   *in a first phase guiding the wire conductor over and away from a region formed in the substrate accepting the chip unit having the terminal area and fixing the wire conductor onto the substrate relative to the region accepting the chip unit, the wire conductor being unconnected to the region accepting the chip unit; and*
   *in a second phase, effecting a direct connection of the wire conductor to the terminal area of the chip unit, wherein the chip unit is disposed in the region accepting the chip unit, with a connecting instrument such that the wire conductor is connected to the terminal area while the wire conductor is fixed on the substrate and extending in parallel to the surface plane of the windings of the wire coil.*

\* \* \* \* \*